(12) United States Patent
Miyazaki et al.

(10) Patent No.: US 9,362,129 B2
(45) Date of Patent: Jun. 7, 2016

(54) POLISHING APPARATUS AND POLISHING METHOD

(71) Applicant: EBARA CORPORATION, Tokyo (JP)

(72) Inventors: Mitsuru Miyazaki, Tokyo (JP); Kenichi Kobayashi, Tokyo (JP); Teruaki Hombo, Tokyo (JP); Akira Imamura, Tokyo (JP); Boyu Dong, Tokyo (JP); Hiroyuki Shinozaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/061,673

(22) Filed: Oct. 23, 2013

(65) Prior Publication Data

US 2014/0120725 A1 May 1, 2014

(30) Foreign Application Priority Data

Oct. 26, 2012 (JP) ................................. 2012-236654

(51) Int. Cl.
| | |
|---|---|
| B24B 37/10 | (2012.01) |
| B24B 37/30 | (2012.01) |
| B24B 37/34 | (2012.01) |
| H01L 21/306 | (2006.01) |
| H01L 21/67 | (2006.01) |

(52) U.S. Cl.
CPC .......... *H01L 21/30625* (2013.01); *B24B 37/30* (2013.01); *B24B 37/34* (2013.01); *B24B 37/345* (2013.01); *H01L 21/67051* (2013.01); *H01L 21/67219* (2013.01)

(58) Field of Classification Search
CPC ........ B24B 37/00; B24B 37/10; B24B 37/30; B24B 37/32; B24B 37/34; B24B 37/345; B24B 53/017; H01L 21/3065; H01L 21/67051; H01L 21/67219
USPC .............................. 451/41, 56, 285, 287, 290
See application file for complete search history.

(56) References Cited

U.S. PATENT DOCUMENTS

| | | | | |
|---|---|---|---|---|
| 5,545,076 | A * | 8/1996 | Yun et al. ....................... | 451/287 |
| 6,050,884 | A | 4/2000 | Togawa et al. | |
| 6,287,178 | B1 * | 9/2001 | Huynh et al. .................... | 451/73 |
| 6,293,855 | B1 * | 9/2001 | Yoshida et al. ................. | 451/67 |
| 6,402,598 | B1 * | 6/2002 | Ahn et al. ........................ | 451/65 |
| 6,659,116 | B1 | 12/2003 | Williams et al. | |
| 6,726,777 | B1 * | 4/2004 | Sonoda et al. .................... | 134/7 |

(Continued)

FOREIGN PATENT DOCUMENTS

| | | |
|---|---|---|
| JP | 62-224563 | 10/1987 |
| JP | 07-299734 A | 11/1995 |
| JP | 09-174420 A | 7/1997 |

(Continued)

*Primary Examiner* — Eileen Morgan
(74) *Attorney, Agent, or Firm* — Baker & Hostetler LLP

(57) ABSTRACT

A polishing apparatus is used for polishing a surface of a substrate such as a semiconductor wafer to planarize the surface of the substrate. The polishing apparatus includes a polishing table having a polishing surface, and a top ring configured to hold a substrate with an outer circumferential edge of the substrate surrounded by a retainer ring and to press the substrate against the polishing surface. The top ring is movable between a polishing position above the polishing table, a position laterally of the polishing table, and a cleaning position. The polishing apparatus includes a cleaning unit disposed in the cleaning position and configured to eject a cleaning liquid toward the lower surface of the top ring, which is being rotated, thereby cleaning the substrate held by the top ring together with the lower surface of the top ring.

9 Claims, 7 Drawing Sheets

(56) References Cited

U.S. PATENT DOCUMENTS

| | | |
|---|---|---|
| 6,878,044 B2 * | 4/2005 | Sakurai et al. .................. 451/67 |
| 7,063,600 B2 * | 6/2006 | Yoshida et al. ................. 451/67 |
| 7,632,378 B2 * | 12/2009 | Sakurai et al. ........... 156/345.31 |

FOREIGN PATENT DOCUMENTS

| | | |
|---|---|---|
| JP | 09-254017 | 9/1997 |
| JP | 2008-272902 | 11/2008 |
| JP | 2010-050436 A | 3/2010 |

* cited by examiner

POLISHING APPARATUS AND POLISHING METHOD

CROSS REFERENCE TO RELATED APPLICATIONS

This document claims priority to Japanese Application Number 2012-236654, filed Oct. 26, 2012, the entire contents of which are hereby incorporated by reference.

BACKGROUND OF THE INVENTION

1. Field of the Invention

The present invention relates to a polishing apparatus and a polishing method, and more particularly to a polishing apparatus and a polishing method for polishing a surface of a substrate such as a semiconductor wafer to planarize the surface of the substrate.

2. Description of the Related Art

A polishing apparatus for polishing a surface of a substrate such as a semiconductor wafer generally has a loading/unloading section, a polishing section, and a cleaning section. The polishing section includes a polishing unit that has a polishing table having a polishing surface comprising a polishing pad, and a top ring (polishing head) for holding the substrate. In the polishing unit, while the substrate held by the top ring is pressed against the polishing surface of the polishing pad under a certain pressure, the polishing table and the top ring are moved relative to each other to bring the substrate in sliding contact with the polishing surface, thereby polishing the surface of the substrate to a flat mirror finish. In the polishing unit which performs chemical mechanical polishing (CMP), a polishing liquid (slurry) is supplied to the polishing surface from a polishing liquid supply nozzle during polishing of the substrate. Therefore, after the substrate is polished, polishing residues (particles) such as a polishing liquid, polishing debris and the like remain on the surface of the substrate and a substrate holding surface of the top ring.

In order to remove the polishing residues (particles) remaining on the surface of the substrate after polishing, the cleaning section has a plurality of cleaning modules for performing rough cleaning (primary cleaning) of the surface of the substrate and finish cleaning (secondary cleaning) of the surface of the substrate. The polished substrate is transported by a transport robot or the like from the polishing unit of the polishing section to the cleaning modules of the cleaning section where the substrate is cleaned successively in the primary and secondary cleaning processes. After the substrate is cleaned, the substrate is returned to the loading/unloading section.

However, if a large amount of polishing residues (particles) are attached to the surface of the polished substrate that is transported by the transport robot or the like from the polishing unit of the polishing section to the cleaning module of the cleaning section, even in the cleaning module which performs rough cleaning of the surface of the substrate, the surface of the substrate may possibly be damaged by the particles, or the particles that have been removed may be reattached to the surface of the substrate during cleaning, so that the cleaning capability may deteriorate. In addition, if dirt and dust are attached to the surface of the substrate while the substrate is transported to the polishing unit, the polishing capability of the polishing unit tends to be lowered.

The applicant of the present invention has proposed a polishing apparatus which ejects a cleaning liquid to a top ring located at a substrate transfer position to clean the lower surface of the top ring and the like as disclosed in Japanese laid-open patent publication No. H9-254017. There have also been proposed a planar polishing apparatus which ejects a cleaning liquid toward a polished workpiece held by a block while the polished workpiece is transported, thereby quickly cleaning the polished workpiece as disclosed in Japanese laid-open patent publication No. S62-224563, and a polishing head cleaning apparatus which ejects a cleaning liquid from a cleaning nozzle at a desired angle to a lower surface of a polishing head to clean and remove residual deposits from a retainer ring at the reverse side of the polishing head and a contact area which has contacted the rear surface of the wafer as disclosed in Japanese laid-open patent publication No. 2008-272902.

In order to prevent a substrate with a large amount of polishing residues attached thereto from being introduced into the cleaning module and also to prevent the substrate to which dirt and dust is attached in the middle of its delivery from being introduced into the polishing unit, it is necessary to clean the substrate held by the top ring together with the top ring. It has been customary to eject a cleaning liquid from a cleaning nozzle disposed at a substrate transfer position toward the lower surface of the top ring located at the substrate transfer position, thereby cleaning the substrate held by the top ring together with the lower surface of the top ring.

A mechanism for transferring substrates is provided at the substrate transfer position, and thus it is difficult to place the cleaning nozzle in a position suitable for cleaning the substrate, in the vicinity of the substrate held by the top ring that is located at the substrate transfer position. Consequently, the cleaning liquid cannot be ejected from an optimum position toward the substrate or a desired position of the lower surface of the top ring, and thus a sufficient cleaning capability cannot be obtained.

The apparatuses disclosed in laid-open Japanese patent publication No. H9-254017 and Japanese laid-open patent publication No. 2008-272902 are not configured to clean the substrate held on the lower surface of the top ring together with the lower surface of the top ring. The apparatus disclosed in Japanese laid-open patent publication No. S62-224563 is configured to eject the cleaning liquid toward the polished workpiece that is being transported, and does not take into account anything about cleaning the lower surface of the block that holds the workpiece.

SUMMARY OF THE INVENTION

The present invention has been made in view of the above drawbacks. It is therefore an object of the present invention to provide a polishing apparatus and a polishing method which are capable of efficiently cleaning a substrate held on a lower surface of a top ring together with the lower surface of the top ring to stabilize a polishing capability, and to stabilize a cleaning capability of a cleaning module that is used to clean the substrate after the substrate is removed from the top ring.

In order to achieve the above object, according to one aspect of the present invention, there is provided a polishing apparatus for polishing a substrate, comprising: a polishing table having a polishing surface; a top ring configured to hold a substrate with an outer circumferential edge of the substrate surrounded by a retainer ring and to press the substrate against the polishing surface, the top ring being movable between a polishing position above the polishing table, a position laterally of the polishing table, and a cleaning position; and a cleaning unit disposed in the cleaning position and configured to eject a cleaning liquid toward a lower surface of the top ring, which is being rotated, thereby cleaning the substrate held by the top ring together with the lower surface of the top ring.

According to the present invention, since the cleaning unit ejects the cleaning liquid toward the lower surface of the rotating top ring that is placed at the cleaning position, the cleaning unit for ejecting the cleaning liquid can be disposed in a position optimum for cleaning, without being obstructed by the existence of a substrate transfer mechanism or the like. Therefore, the cleaning unit is capable of efficiently cleaning the substrate held on the lower surface of the top ring together with the lower surface of the top ring.

According to a preferred aspect of the present invention, the position laterally of the polishing table comprises a substrate transfer position laterally of the polishing table, and the cleaning position is located between the polishing position and the substrate transfer position.

According to the present invention, the substrate held by the top ring can be cleaned together with the lower surface of the top ring while the top ring is being moved from the substrate transfer position to the polishing position.

According to a preferred aspect of the present invention, the cleaning unit has a first cleaning nozzle having a plurality of ejection ports disposed along the outer circumferential edge of the substrate that is held by the top ring located at the cleaning position.

According to the present invention, the ejection ports of the first cleaning nozzle eject the cleaning liquid toward a clearance created between the outer circumferential edge of the substrate held by the top ring and the retainer ring that surrounds the outer circumferential edge of the substrate, thereby efficiently cleaning the clearance.

According to a preferred aspect of the present invention, the cleaning unit has a second cleaning nozzle having a plurality of ejection ports disposed along a diametrical direction of the substrate that is held by the top ring located at the cleaning position.

According to the present invention, the ejection ports of the second cleaning nozzle eject the cleaning liquid toward the surface of the substrate held by the top ring, thereby efficiently cleaning the entire surface of the substrate.

According to a preferred aspect of the present invention, the ejection ports of the first cleaning nozzle are disposed at equally spaced intervals along the outer circumferential edge of the substrate, and the ejection ports of the second cleaning nozzle are disposed at equally spaced intervals along the diametrical direction of the substrate.

According to the present invention, the cleaning unit is capable of cleaning the substrate held by the top ring and the lower surface of the top ring more uniformly.

According to a preferred aspect of the present invention, the first cleaning nozzle has a semicircular shape, and the second cleaning nozzle has a straight shape.

According to the present invention, the cleaning unit which includes the first cleaning nozzle and the second cleaning nozzle can be reduced in size to meet an installation space for the cleaning unit.

According to a preferred aspect of the present invention, the polishing apparatus further comprises another cleaning unit provided separately from the cleaning unit and configured to clean the substrate cleaned by the cleaning unit; and a transfer mechanism configured to transfer the substrate from the substrate transfer position and the another cleaning unit.

According to another aspect of the present invention, there is provided a polishing method for polishing a substrate, comprising: placing a top ring which holds a substrate with an outer circumferential edge of the substrate surrounded by a retainer ring, at a cleaning position, while the top ring is moving from a position laterally of a polishing table to a polishing position above the polishing table and/or from the polishing position above the polishing table to the position laterally of the polishing table; and ejecting a cleaning liquid toward a lower surface of the top ring, which is being rotated, at the cleaning position to clean the substrate held by the top ring together with the lower surface of the top ring.

According to a preferred aspect of the present invention, the position laterally of the polishing table comprises a substrate transfer position.

According to a preferred aspect of the present invention, after cleaning the substrate held by the top ring together with the lower surface of the top ring at the cleaning position, the substrate is transferred to a substrate transfer position; and the substrate is removed from the top ring at the substrate transfer position and is then transferred to another cleaning position provided separately from the cleaning position, and the polished substrate is cleaned at the another cleaning position.

According to the present invention, since the cleaning unit ejects the cleaning liquid toward the lower surface of the rotating top ring that is placed at the cleaning position between the polishing position and the substrate transfer position, the cleaning unit for ejecting the cleaning liquid can be disposed in a position optimum for cleaning, without being obstructed by the existence of a substrate transfer mechanism or the like, and is capable of efficiently cleaning the substrate held on the lower surface of the top ring together with the lower surface of the top ring. In particular, because the ejection ports of the first cleaning nozzle are placed in respective positions along the outer circumferential edge of the substrate that is held by the top ring positioned at the cleaning position, the cleaning unit is capable of efficiently cleaning the clearance created between the outer circumferential edge of the substrate held by the top ring and the retainer ring which surrounds the outer circumferential edge of the substrate. Therefore, the polishing capability can be stabilized, and the cleaning capability of a cleaning module that is used to clean the substrate after the substrate is removed from the top ring can be stabilized.

DETAILED DESCRIPTION OF THE PREFERRED EMBODIMENTS

Figure 1:
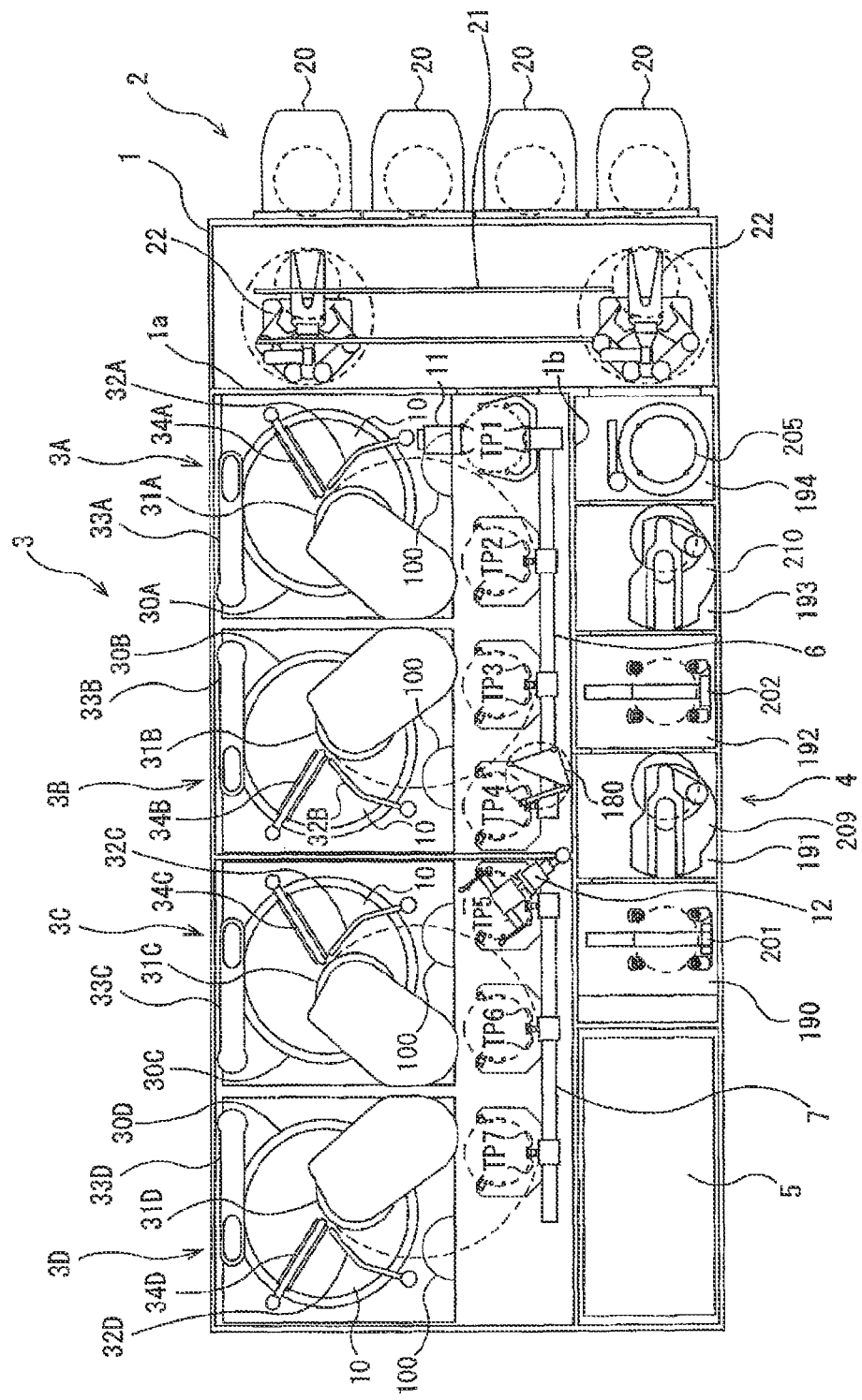
FIG. 1 is a plan view showing a whole arrangement of a polishing apparatus according to an embodiment of the present invention.

FIG. 1 is a plan view showing a whole arrangement of a polishing apparatus according to an embodiment of the present invention. As shown in FIG. 1, the polishing apparatus has a housing 1 in a rectangular form. An interior space of the housing 1 is divided into a loading/unloading section 2, a polishing section 3, and a cleaning section 4 by partition walls 1a and 1b. The loading/unloading section 2, the polishing section 3, and the cleaning section 4 are assembled independently of each other, and air is discharged from these sections independently of each other. The polishing apparatus further includes a controller 5 for controlling substrate processing operations.

The loading/unloading section 2 has two or more (four in this embodiment) front loading units 20 on which substrate cassettes, each storing plural substrates such as semiconductor wafers, are placed. The front loading units 20 are arranged adjacent to the housing 1 along a width direction of the polishing apparatus (a direction perpendicular to a longitudinal direction of the polishing apparatus). Each of the front loading units 20 is capable of receiving thereon an open cassette, an SMIF (Standard Manufacturing Interface) pod, or a FOUP (Front Opening Unified Pod). The SMIF and FOUP are a hermetically sealed container which houses a substrate cassette therein and is covered with a partition to thereby provide interior environments isolated from an external space.

The loading/unloading section 2 has a moving mechanism 21 extending along an arrangement direction of the front loading units 20. Two transport robots (loaders) 22 are installed on the moving mechanism 21 and are movable along the arrangement direction of the front loading units 20. The transport robots 22 are configured to move on the moving mechanism 21 so as to access the substrate cassettes mounted on the front loading units 20. Each transport robot 22 has vertically arranged two hands, which are separately used. The upper hand can be used for returning a processed substrate to the substrate cassette, and the lower hand can be used for taking out a substrate to be processed from the substrate cassette. The lower hand of the transport robot 22 is configured to rotate about its own axis, so that it can reverse the substrate.

The loading/unloading section 2 is required to be a cleanest area. Therefore, pressure in the interior of the loading/unloading section 2 is kept higher at all times than pressures in the exterior space of the polishing apparatus, the polishing section 3, and the cleaning section 4. On the other hand, the polishing section 3 is the dirtiest area, because slurry is used as a polishing liquid. Therefore, negative pressure is developed in the polishing section 3, and the pressure in polishing section 3 is kept lower than the internal pressure of the cleaning section 4. A filter fan unit (not shown) having a clean air filter, such as HEPA filter, ULPA filter or a chemical filter, is provided in the loading/unloading section 2. This filter fan unit removes particles, toxic vapor, and toxic gas from air to form flow of clean air at all times.

The polishing section 3 is an area where a surface of a substrate is polished (planarized). This polishing section 3 includes a first polishing unit 3A, a second polishing unit 3B, a third polishing unit 3C, and a fourth polishing unit 3D. The first polishing unit 3A, the second polishing unit 3B, the third polishing unit 3C, and the fourth polishing unit 3D are arranged along the longitudinal direction of the polishing apparatus.

The first polishing unit 3A includes a polishing table 30A to which a polishing pad 10 having a polishing surface is attached, a top ring 31A for holding a substrate and pressing the substrate against the polishing pad 10 on the polishing table 30A to polish the substrate, a polishing liquid supply nozzle 32A for supplying a polishing liquid and a dressing liquid (e.g., pure water) onto the polishing pad 10, a dresser 33A for dressing the polishing surface of the polishing pad 10, and an atomizer 34A for ejecting a mixture of a liquid (e.g., pure water) and a gas (e.g., nitrogen gas) or a liquid (e.g., pure water) in an atomized state onto the polishing surface of the polishing pad 10.

Similarly, the second polishing unit 3B includes a polishing table 30B to which a polishing pad 10 is attached, a top ring 31B, a polishing liquid supply nozzle 32B, a dresser 33B, and an atomizer 34B. The third polishing unit 3C includes a polishing table 30C to which a polishing pad 10 is attached, a top ring 31C, a polishing liquid supply nozzle 32C, a dresser 33C, and an atomizer 34C. The fourth polishing unit 3D includes a polishing table 30D to which a polishing pad 10 is attached, a top ring 31D, a polishing liquid supply nozzle 32D, a dresser 33D, and an atomizer 34D.

The first polishing unit 3A, the second polishing unit 3B, the third polishing unit 3C, and the fourth polishing unit 3D have the same configuration. Therefore, the first polishing unit 3A will be described below.

Figure 2:
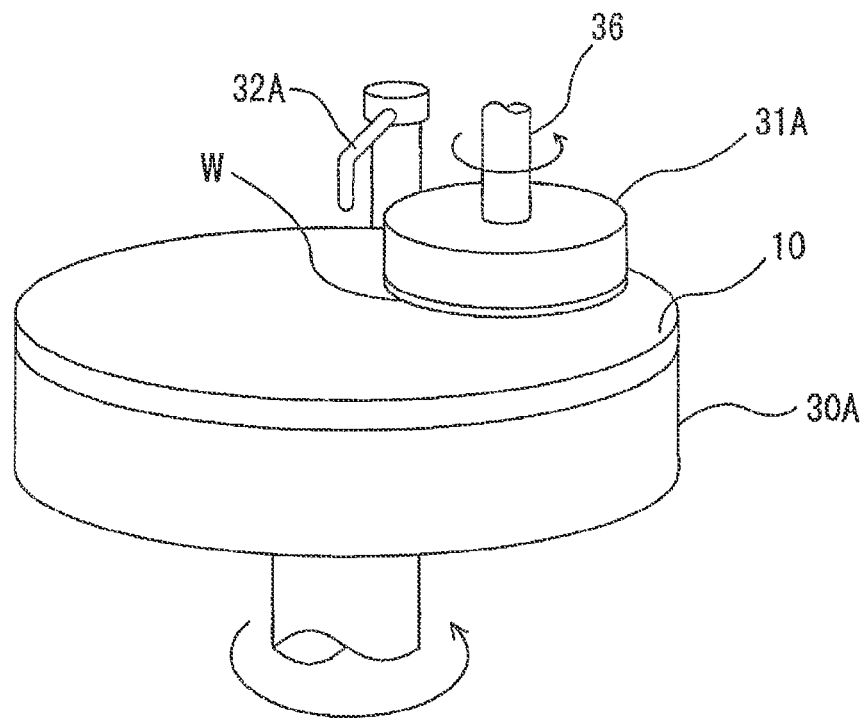
FIG. 2 is a perspective view schematically showing a first polishing unit.

FIG. 2 is a perspective view schematically showing the first polishing unit 3A. The top ring 31A is supported by a top ring shaft 36. The polishing pad 10 is attached to an upper surface of the polishing table 30A. An upper surface of the polishing pad 10 provides the polishing surface where a substrate W is polished. Instead of the polishing pad 10, a fixed abrasive may be used. The top ring 31A and the polishing table 30A are configured to rotate about their own axes, as indicated by arrows. The substrate W is held on a lower surface of the top ring 31A via vacuum suction. During polishing of the substrate W, the polishing liquid supply nozzle 32A supplies the polishing liquid onto the polishing surface of the polishing pad 10, and the top ring 31A presses the substrate W as an object to be polished against the polishing surface to thereby polish the substrate W.

Figure 3:
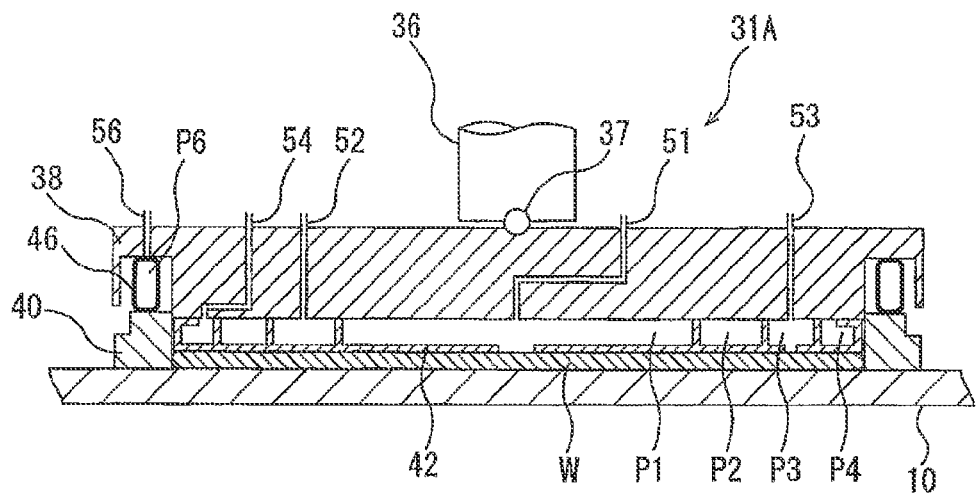
FIG. 3 is a cross-sectional view schematically showing a structure of a top ring.

FIG. 3 is a cross-sectional view schematically showing the top ring 31A. The top ring 31A is coupled to a lower end of the top ring shaft 36 via a universal joint 37. This universal joint 37 is a ball joint configured to transmit rotation of the top ring shaft 36 to the top ring 31A while allowing the top ring 31A and the top ring shaft 36 to tile with respect to each other. The top ring 31A has a top ring body 38 in substantially a disk shape and a retainer ring 40 provided on a lower portion of the top ring body 38. The top ring body 38 is made of a material having high strength and rigidity, such as metal or ceramic. The retainer ring 40 is made of highly rigid resin, ceramic, or the like.

The top ring body 38 has a lower surface to which a circular elastic pad 42 arranged to be brought into contact with the substrate W is attached. Four pressure chambers (air bags) P1, P2, P3, and P4 are provided between the elastic pad 42 and the top ring body 38. A pressurized fluid (e.g., a pressurized air) is supplied into the pressure chambers P1, P2, P3, and P4 or a vacuum is developed in the pressure chambers P1, P2, P3, and P4 via fluid passages 51, 52, 53, and 54, respectively. The central pressure chamber P1 has a circular shape, and the other pressure chambers P2, P3, and P4 have an annular shape. These pressure chambers P1, P2, P3, and P4 are in a concentric arrangement.

Internal pressures of the pressure chambers P1, P2, P3, and P4 can be changed independently by a pressure adjuster to independently adjust pressing forces applied to four zones: a central zone, an inner intermediate zone, an outer intermediate zone, and a peripheral zone.

A retainer ring 40 is arranged around the periphery of the substrate W so as to prevent the substrate W from coming off the top ring 31A during polishing of the substrate W. An opening is formed in a portion of the elastic pad 42 which forms the pressure chamber P3. When a vacuum is developed in the pressure chamber P3, the substrate W is held by the top ring 31A via vacuum suction. On the other hand, the substrate W is released from the top ring 31A by supplying a nitrogen gas, dry air, pressurized air, or the like into the pressure chamber P3.

An elastic bag 46 is provided between the retainer ring 40 and the top ring body 38, and a pressure chamber P6 is formed in the elastic bag 46. The retainer ring 40 is movable in the vertical direction relative to the top ring body 38. A fluid passage 56 in fluid communication with the pressure chamber P6 is provided, so that the pressurized fluid (e.g., the pressurized air) is supplied into the pressure chamber P6 through the fluid passage 56. Internal pressure of the pressure chamber P6 is adjustable via the pressure adjuster. Therefore, the pressing force of the retainer ring 40 against the polishing pad 10 can be adjusted independently of the pressing force applied to the substrate W.

A substrate may be polished by either one of the first polishing unit 3A, the second polishing unit 3B, the third polishing unit 3C, and the fourth polishing unit 3D. Alternatively, the substrate may be polished successively by a plurality of polishing units selected from the first through fourth polishing units 3A through 3D. For example, the substrate may be polished successively in the order of the first polishing unit 3A and the second polishing unit 3B, or may be polished successively in the order of the third polishing unit 3C and the fourth polishing unit 3D. Further, the substrate may be polished successively in the order of the first polishing unit 3A, the second polishing unit 3B, the third polishing unit 3C, and the fourth polishing unit 3D. In any of these polishing sequences, the polishing times consumed respectively by the first through fourth polishing units 3A through 3D may be equalized to achieve an increased throughput of polished substrates.

A first linear transporter 6 is disposed adjacent to the first polishing unit 3A and the second polishing unit 3B. The first linear transporter 6 is a mechanism for transporting a substrate between four transport positions, i.e., a first transport position TP1, a second transport position TP2, a third transport position TP3, and a fourth transport position TP4 spaced successively from the loading/unloading section 2, arrayed along the direction in which the first polishing unit 3A and the second polishing unit 3B are arrayed.

A second linear transporter 7 is disposed adjacent to the third polishing unit 3C and the fourth polishing unit 3D. The second linear transporter 7 is a mechanism for transporting a substrate between three transport positions, i.e., a fifth transport position TP5, a sixth transport position TP6, and a seventh transport position TP7 spaced successively from the loading/unloading section 2, arrayed along the direction in which the third polishing unit 3C and the fourth polishing unit 3D are arrayed.

A substrate is transported to the first polishing unit 3A and the second polishing unit 3B by the first linear transporter 6. The top ring 31A of the first polishing unit 3A is movable between a polishing position above the polishing table 30A and the second transport position TP2 laterally of the polishing table 30A. Therefore, the transfer of the substrate to the top ring 31A is performed at the second transport position TP2, and the second transport position TP2 becomes a substrate transfer position T (see FIG. 4). Similarly, the top ring 31B of the second polishing unit 3B is movable between a polishing position above the polishing table 30B and the third transport position TP3 laterally of the polishing table 30B. The transfer of the substrate to the top ring 31B is performed at the third transport position TP3 as a substrate transfer position. The top ring 31C of the third polishing unit 3C is movable between a polishing position above the polishing table 30C and the sixth transport position TP6 laterally of the polishing table 30C. The transfer of the substrate to the top ring 31C is performed at the sixth transport position TP6 as a substrate transfer position. The top ring 31D of the fourth polishing unit 3D is movable between a polishing position above the polishing table 30D and the seventh transport position TP7 laterally of the polishing table 30D. The transfer of the substrate to the top ring 31D is performed at the seventh transport position TP7 as a substrate transfer position.

A lifter 11 for receiving the substrate from the transport robot 22 is disposed in the first transport position TP1. The substrate is transferred from the transport robot 22 to the first linear transporter 6 by the lifter 11. The partition 1a has a shutter (not shown) positioned therein between the lifter 11 and the transport robot 22. When the substrate is to be transferred, the shutter is opened to allow the transport robot 22 to transfer the substrate to the lifter 11. A swing transporter 12 having a reversing function is disposed between the first linear transporter 6, the second linear transporter 7, and the cleaning section 4. The swing transporter 12 has a hand movable between the fourth transport position TP4 and the fifth transport position TP5. The transfer of the substrate from the first linear transporter 6 to the second linear transporter 7 is performed by the swing transporter 12. The substrate is transported by the second linear transporter 7 to the third polishing unit 3C and/or the fourth polishing unit 3D. Further, the substrate that has been polished in the polishing section 3 is transported to the cleaning section 4 by the swing transporter 12.

A temporary placement table 180 for temporarily placing a substrate thereon is installed on a frame and disposed laterally of the swing transporter 12. The temporary placement table 180 is disposed adjacent to the first linear transporter 6 and positioned between the first linear transporter 6 and the cleaning section 4. The substrate that has been temporarily placed on the temporary placement table 180 is transported to the cleaning section 4 by a transport robot of the cleaning section 4 to be described below.

As described above, the top ring 31A of the first polishing unit 3A is movable between a polishing position above the polishing table 30A and the second transport position TP2 as a substrate transfer position laterally of the polishing table 30A. Further, the top ring 31A of the first polishing unit 3A is configured to stop at a cleaning position C between the above polishing position and the second transport position TP2 as the substrate transfer position. An auxiliary cleaning unit 100 is disposed in a position corresponding to the cleaning position C for the top ring 31A.

Similarly, the top ring 31B of the second polishing unit 3B is configured to stop at a cleaning position between the polishing position above the polishing table 30B and the third transport position TP3 as a substrate transfer position laterally of the polishing table 30B. An auxiliary cleaning unit 100 is disposed in a position corresponding to the cleaning position for the top ring 31B. The top ring 31C of the third polishing unit 3C is configured to stop at a cleaning position between the polishing position above the polishing table 30C and the sixth transport position TP6 as a substrate transfer position laterally of the polishing table 30C. An auxiliary cleaning unit 100 is disposed in a position corresponding to the cleaning position for the top ring 31C. The top ring 31D of the fourth polishing unit 3D is configured to stop at a cleaning position between the polishing position above the polishing table 30D and the seventh transport position TP7 as a substrate transfer position laterally of the polishing table 30D. An auxiliary cleaning unit 100 is disposed in a position corresponding to the cleaning position for the top ring 31D.

Figure 4:
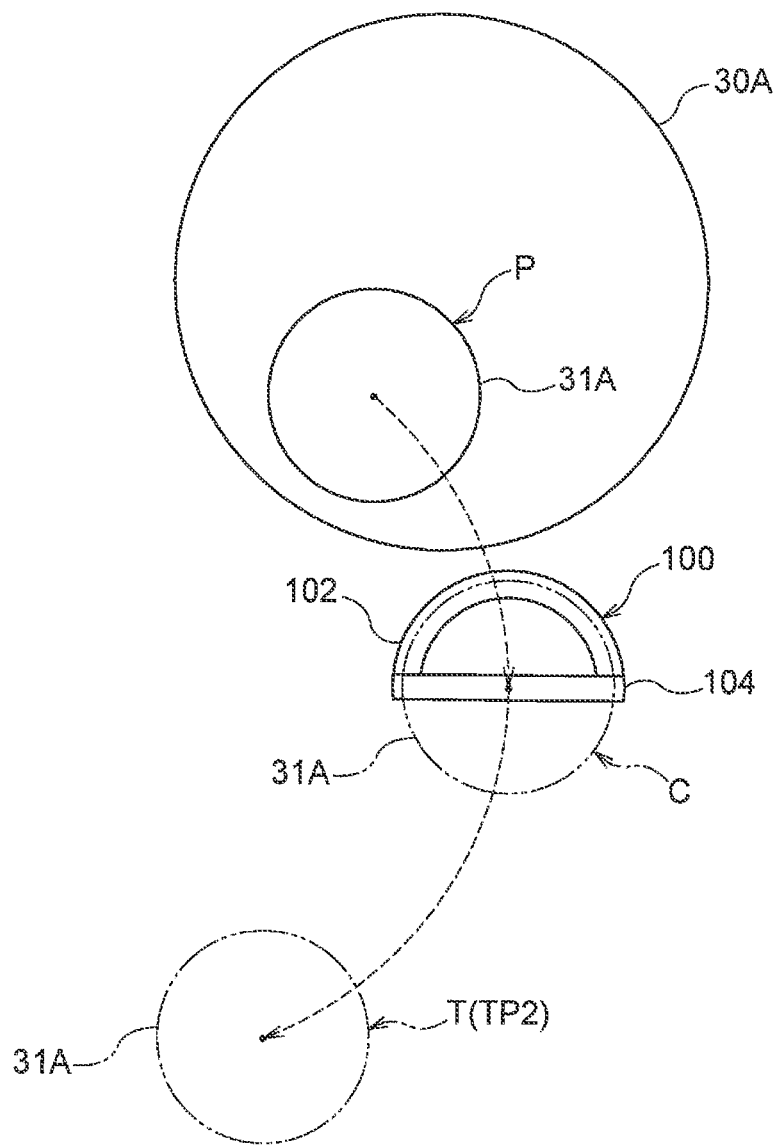
FIG. 4 is a plan view schematically showing an example of the positional relationship between a polishing table, a top ring and an auxiliary cleaning unit in the first polishing unit.

FIG. 4 is a plan view schematically showing an example of the positional relationship between the polishing table 30A, the top ring 31A, and the auxiliary cleaning unit 100 disposed in the position corresponding to the cleaning position for the top ring 31A in the first polishing unit 3A, the view also showing the polishing position P of the top ring 31A and the second transport position TP2 as the substrate transfer position T. The positional relationship between the polishing table 30B, the top ring 31B, and the auxiliary cleaning unit 100 disposed in the position corresponding to the cleaning position for the top ring 31B in the second polishing unit 3B; the positional relationship between the polishing table 30C, the top ring 31C, and the auxiliary cleaning unit 100 disposed in the position corresponding to the cleaning position for the top ring 31C in the third polishing unit 3C; and the positional relationship between the polishing table 30D, the top ring 31D, and the auxiliary cleaning unit 100 disposed in the position corresponding to the cleaning position for the top ring 31D in the fourth polishing unit 3D are essentially the same as the positional relationship shown in FIG. 4, and will not be described in duplication.

As shown in FIG. 4, the top ring 31A is movable between the polishing position P, indicated by a solid line, above the polishing table 30A, the second transport position TP2 as the substrate transport position T, indicated by a two-dot chain line, laterally of the polishing table 30A, and the cleaning position C, indicated by a two-dot chain line, between the polishing position P and the substrate transfer position T. The auxiliary cleaning unit 100 is disposed in a position corresponding to the top ring 31A that is positioned at the cleaning position C.

Specifically, the auxiliary cleaning unit 100 has a first cleaning nozzle 102 extended in a semicircular shape and a second cleaning nozzle 104 extending in a straight shape. When the top ring 31A is positioned at the cleaning position C, the auxiliary cleaning unit 100 is positioned below the substrate W that is held on the lower surface of the top ring 31A positioned at the cleaning position C such that the first cleaning nozzle 102 is positioned along the outer circumferential edge of the substrate W held on the lower surface of the top ring 31A, and the second cleaning nozzle 104 is positioned along the diametrical direction of the substrate W. Thus, the auxiliary cleaning unit 100 can be disposed in a position suitable for cleaning, without being obstructed by the existence of the substrate transfer mechanism or the like.

Figure 5:
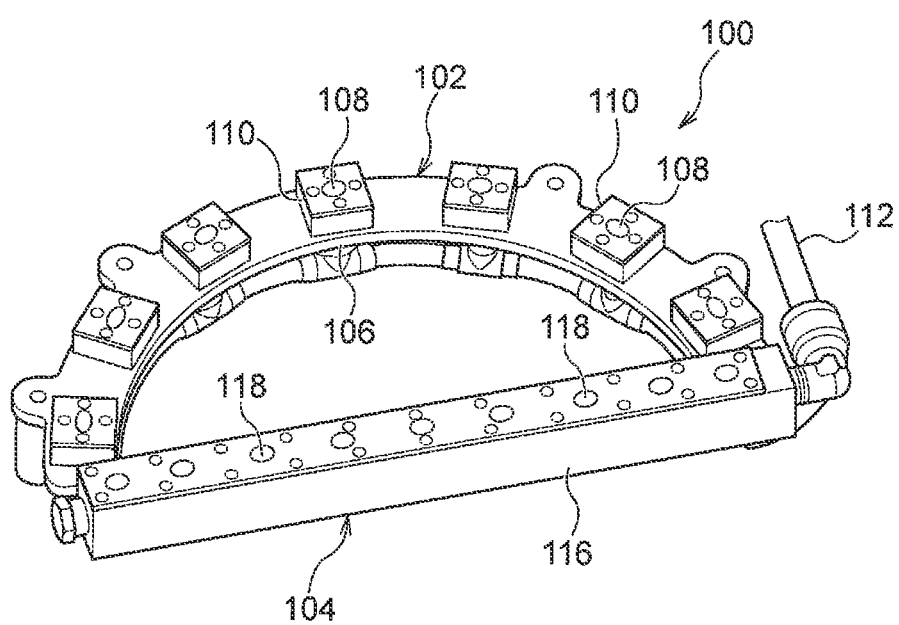
FIG. 5 is a perspective view showing the auxiliary cleaning unit.
Figure 6:
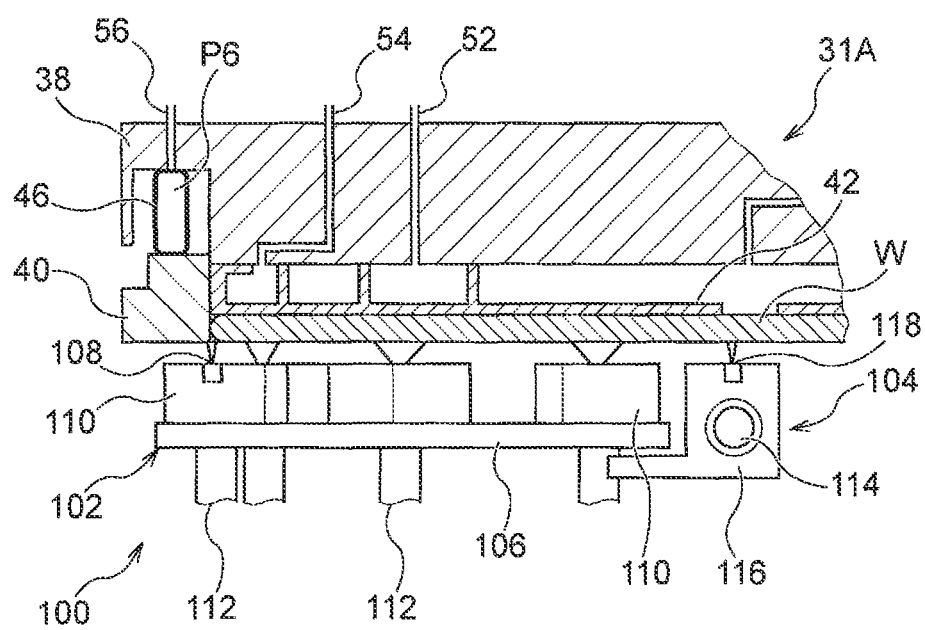
FIG. 6 is a cross-sectional view schematically showing the manner in which a cleaning liquid is ejected from the auxiliary cleaning unit toward the lower surface of the top ring to clean the surface of the substrate held by the top ring as well as the lower surface of the top ring.

FIG. 5 is a perspective view of the auxiliary cleaning unit 100. FIG. 6 is an enlarged fragmentary cross-sectional view schematically showing the manner in which a cleaning liquid is ejected from the auxiliary cleaning unit 100 toward the lower surface of the top ring 31A to clean the surface (lower surface) of the substrate W that is held by the top ring 31A as well as the lower surface of the top ring 31A.

As shown in FIGS. 5 and 6, the first cleaning nozzle 102 comprises a plurality of (seven in the illustrated embodiment) nozzle members 110, having respective ejection ports 108 directed upwardly, which are mounted on an upper surface of a semiannular support plate 106 at equally spaced intervals along the circumferential direction of the support plate 106.

The nozzle members 110 are connected to a cleaning liquid supply line 112. The second cleaning nozzle 104 has an elongate nozzle body 116 having a rectangular transverse cross-section, and the nozzle body 116 has a cleaning liquid passage 114 defined therein which communicates with the cleaning liquid supply line 112. The nozzle body 116 has a plurality of (nine in the illustrated embodiment) ejection ports 118 defined in an upper surface thereof at equally spaced intervals along the longitudinal direction of the nozzle body 116. The ejection ports 118 are held in fluid communication with the cleaning liquid passage 114.

In this embodiment, as a cleaning liquid that is ejected from the ejection ports 108 of the first cleaning nozzle 102 and the ejection ports 118 of the second cleaning nozzle 104, a mixed fluid comprising a mist of liquid (e.g., pure water) and a gas (e.g., a nitrogen gas), or a liquid (e.g., pure water) is used. The ejection ports 108 of the first cleaning nozzle 102 are configured to eject the cleaning liquid spreading out in a fan-like form along the circumferential direction of the first cleaning nozzle 102. The ejection ports 118 of the second cleaning nozzle 104 are configured to eject the cleaning liquid spreading out in a fan-like form along the longitudinal direction of the second cleaning nozzle 104.

Further, the nozzle members 110 of the first cleaning nozzle 102 and the nozzle body 116 of the second cleaning nozzle 104 have respective upper surfaces lying flush with the upper surface of the polishing table 30A. The top ring 31A is movable over the upper surfaces of the nozzle members 110 and the nozzle body 116.

As shown in FIG. 6, the ejection ports 108 of the first cleaning nozzle 102 are disposed in positions along the outer circumferential edge of the substrate W that is held by the top ring 31A positioned at the cleaning position C. Thus, the ejection ports 108 of the first cleaning nozzle 102 can eject the cleaning liquid toward a clearance between the outer circumferential edge of the substrate W held by the top ring 31A and the retainer ring 40 that surrounds the outer circumferential edge of the substrate W, thereby cleaning the clearance efficiently.

Further, the ejection ports 118 of the second cleaning nozzle 104 are disposed at positions along the diametrical direction of the substrate W held by the top ring 31A positioned at the cleaning position C. Thus, the ejection ports 118 of the second cleaning nozzle 104 can eject the cleaning liquid toward the surface (lower surface) of the substrate W held by the top ring 31A, thereby cleaning the entire lower surface of the substrate W efficiently.

According to this embodiment, when the top ring 31A which holds the substrate W on its lower surface is positioned at the cleaning position C, the ejection ports 108 of the first cleaning nozzle 102 and the ejection ports 118 of the second cleaning nozzle 104 eject the cleaning liquid upwardly toward the lower surface of the top ring 31A while the top ring 31A is being rotated. Thus, the clearance created between the outer circumferential edge of the substrate W and the retainer ring 40 that surrounds the outer circumferential edge of the substrate W is mainly cleaned by the cleaning liquid ejected from the ejection ports 108 of the first cleaning nozzle 102, and the lower surface of the substrate W is mainly cleaned by the cleaning liquid ejected from the ejection ports 118 of the second cleaning nozzle 104.

This cleaning is performed on the substrate W held by the top ring 31A located at the cleaning position C between the polishing position P and the substrate transfer position T. Therefore, the auxiliary cleaning unit 100 which has the first cleaning nozzle 102 and the second cleaning nozzle 104 used for cleaning can be disposed in a position optimum for cleaning, without being obstructed by the existence of the substrate transfer mechanism or the like. Therefore, the auxiliary cleaning unit 100 is capable of efficiently cleaning the substrate W held on the lower surface of the top ring 31A together with the lower surface of the top ring 31A.

In the present embodiment, the cleaning position C is selected such that when the top ring 31A is placed at the cleaning position C, the top ring 31A does not vertically overlap the polishing table 30A, and the auxiliary cleaning unit 100 is disposed such that the first cleaning nozzle 102 is positioned closer to the polishing table 30A.

Figure 7:
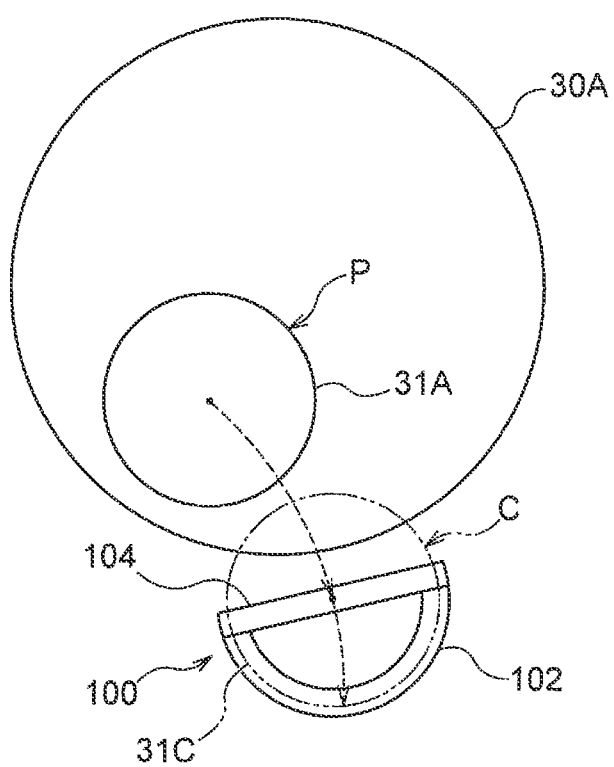
FIG. 7 is a plan view schematically showing another example of the positional relationship between the polishing table, the top ring, and the auxiliary cleaning unit in the first polishing unit.

FIG. 7 is a plan view schematically showing another example of the positional relationship between the polishing table 30A, the top ring 31A, and the auxiliary cleaning unit 100 in the first polishing unit. As shown in FIG. 7, the cleaning position C is selected such that when the top ring 31A is placed at the cleaning position C, the top ring 31A has a portion vertically overlapping the polishing table 30A, and the auxiliary cleaning unit 100 is disposed so as not to interfere with the polishing table 30A such that the second cleaning nozzle 104 is positioned closer to the polishing table 30A. In this manner, an area taken up by the auxiliary cleaning unit 100 can be further smaller. In this example also, the nozzle members 110 of the first cleaning nozzle 102 and the nozzle body 116 of the second cleaning nozzle 104 have respective upper surfaces lying flush with the upper surface of the polishing table 30A, and the top ring 31A is movable over the upper surfaces of the nozzle members 110 and the nozzle body 116.

Figure 8:
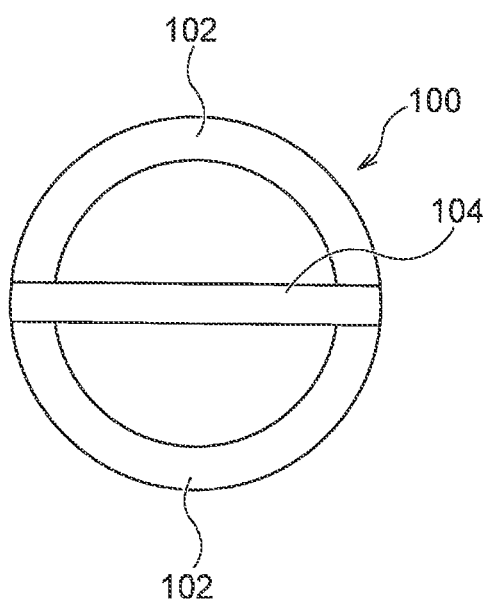
FIG. 8 is a plan view showing another auxiliary cleaning unit.

Further, if a sufficient installation space is ensured, as shown in FIG. 8, an auxiliary cleaning unit 100 may have two first cleaning nozzles 102, each having a semiannular shape, disposed one on each side of a straight second cleaning nozzle 104, so that the two first cleaning nozzles 102 have a circular ring. The two first cleaning nozzles 102 are effective to increase the cleaning capability of the auxiliary cleaning unit 100.

According to the present embodiment, as shown in FIG. 1, the cleaning section 4 is divided into a first cleaning chamber 190, a first transport chamber 191, a second cleaning chamber 192, a second transport chamber 193, and a drying chamber 194. The first cleaning chamber 190 houses therein two primary cleaning modules 201 which are arranged in a vertical array. Similarly, the second cleaning chamber 192 houses therein two secondary cleaning modules 202 which are arranged in a vertical array. Each of the first and second cleaning modules 201, 202 comprises a cleaning machine for cleaning a substrate using a cleaning liquid. Since the first cleaning modules 201 are arranged in a vertical array and the second cleaning modules 202 are arranged in a vertical array, the cleaning section 4 has a reduced footprint or installation area. The second cleaning chamber 192 houses therein a substrate station (not shown) for temporarily placing a substrate thereon.

The drying chamber 194 houses therein two drying modules 205 arranged in a vertical array. The first transport chamber 191 houses a first transport robot 209 which is vertically movable, and the second transport chamber 193 houses a second transport robot 210 which is vertically movable. The first transport robot 209 has two upper and lower hands, and is disposed at a position where the lower hand is accessible to the temporary placement table 180. When the lower hand of the first transport robot 209 accesses the temporary placement table 180, a shutter (not shown) provided in the partition 1b is configured to be opened.

The first transport robot 209 operates to transport a substrate W between the temporary placement table 180, the primary cleaning modules 201, the substrate station, and the secondary cleaning modules 202. For transporting a substrate to be cleaned, i.e., a substrate with a slurry attached thereto, the first transport robot 209 uses the lower hand to carry the substrate. For transporting a substrate which has been cleaned, the first transport robot 209 uses the upper hand to carry the substrate. The second transport robot 210 operates to transport a substrate W between the secondary cleaning modules 202, the substrate station, and the drying modules 205. The second transport robot 210 has only one hand as it carries the substrate which has been cleaned. The transport robot 22 shown in FIG. 1 removes the substrate from one of the drying modules 205 using its upper hand, and returns the removed substrate back into the substrate cassette. When the upper hand of the transport robot 22 accesses the drying modules 205, the shutter (not shown) provided in the partition 1a is configured to be opened.

In the present embodiment, each of the primary cleaning modules 201 and the secondary cleaning modules 202 comprises a roll-sponge type cleaning machine. Further, although the cleaning section 4 includes the two primary cleaning modules 201 and the two secondary cleaning modules 202, the cleaning section 4 may include three or more primary cleaning modules and/or three or more secondary cleaning modules.

The primary cleaning module 201 and the secondary cleaning module 202 may be of the same type or may be of different types. For example, the primary cleaning modules 201 may be a cleaning machine having a pair of roll sponges for scrub-cleaning the upper and lower surfaces of the substrate, and the secondary cleaning modules 202 may be a cleaning machine of a pencil-sponge type or two-fluid-jet type. The two-fluid-jet-type cleaning machine is configured to produce a mixture of an $N_2$ gas and pure water (DIW), containing a small amount of $CO_2$ gas (carbon dioxide gas) dissolved therein, and eject the mixture of the $N_2$ gas and the pure water onto the surface of the substrate. This type of cleaning machine can remove fine particles on the substrate by fine droplets and impact energy. In particular, substrate cleaning with no damage can be realized by appropriately adjusting a flow rate of the $N_2$ gas and a flow rate of the pure water. Further, use of the pure water containing the carbon dioxide gas therein can prevent corrosion of the substrate that could be caused by static electricity.

A sequence of operations for taking out a substrate from a substrate cassette placed in one of the front loading units 20, polishing the surface of the substrate with the first polishing unit 3A of the polishing section 3, and cleaning the polished substrate with the cleaning section 4, and then returning the cleaned substrate to the substrate cassette placed in the front loading unit 20 will be described below.

First, the transport robot 22 removes a substrate W from a substrate cassette placed in one of the front loading units 20, reverses the substrate W to cause its surface to face downwardly, and then transfers the substrate W through the lifter 11 to the first linear transporter 6. The first linear transporter 6 transports the substrate W from the first transport position TP1 to the second transport position TP2 (substrate transfer position T).

The top ring 31A of the first polishing unit 3A receives the substrate W from the first linear transporter 6 at the second transport position TP2 (substrate transfer position T), and moves to the cleaning position C. In the cleaning position C, while the top ring 31A is rotated to rotate the substrate W, the ejection ports 108 of the first cleaning nozzle 102 and the ejection ports 118 of the second cleaning nozzle 104 eject the cleaning liquid to clean the surface (lower surface) of the substrate W held on the lower surface of the top ring 31A together with the lower surface of the top ring 31A.

Then, the top ring 31A of the first polishing unit 3A moves from the cleaning position C to the polishing position P. In the polishing position P, the top ring 31A is lowered to press the substrate W against the surface (polishing surface) of the polishing pad 10. At this time, the top ring 31A and the polishing table 30A are rotated independently of each other, and the polishing liquid supply nozzle 32A disposed above the polishing table 30A supplies the polishing liquid onto the polishing pad 10. In this manner, the substrate W is brought in sliding contact with the polishing surface of the polishing pad 10, thereby polishing the surface of the substrate W.

After the substrate W is polished, the top ring 31A of the first polishing unit 3A is moved from the polishing position P to the cleaning position C. In the same manner as the above, in the cleaning position C, the ejection ports 108 of the first cleaning nozzle 102 and the ejection ports 118 of the second cleaning nozzle 104 eject the cleaning liquid toward the lower surface of the top ring 31A which is being rotated, thereby cleaning the surface (lower surface) of the substrate W held on the lower surface of the top ring 31A together with the lower surface of the top ring 31A.

In the present embodiment, before and after the substrate W is polished by the first polishing unit 3A, the surface (lower surface) of the substrate W held on the lower surface of the top ring 31A as well as the lower surface of the top ring 31A are cleaned by the auxiliary cleaning unit 100. Therefore, dirt and dust attached to the surface of the substrate W are removed during transportation of the substrate W to the first polishing unit 3A before the substrate W is polished. Accordingly, the polishing capability of the polishing unit 3A is stabilized. In addition, since any substrates with a large amount of polishing residues attached to their surfaces are not introduced into the cleaning modules 201, 202 in the cleaning section 4, the cleaning capability of the cleaning modules 201, 202 used in the cleaning section 4 is stabilized. Alternatively, before or after the substrate W is polished by the first polishing unit 3A, the surface (lower surface) of the substrate W held on the lower surface of the top ring 31A as well as the lower surface of the top ring 31A may be cleaned by the auxiliary cleaning unit 100, so that the polishing capability of the polishing unit 3A may be stabilized or the cleaning capability of the cleaning modules 201, 202 used in the cleaning section 4 may be stabilized.

Then, the top ring 31A of the first polishing unit 3A is moved from the cleaning position C to the second transport position TP2 (substrate transfer position T), where the top ring 31A transfers the polished substrate W to the first linear transporter 6. The first linear transporter 6 then transports the polished substrate W through the third transport position TP3 to the fourth transport position TP4.

The swing transporter 12 receives the substrate W placed in the fourth transport position TP4 from the first linear transporter 6, reverses the substrate W to cause its surface to face upwardly, and then transports the substrate W to the temporary placement table 180 to place the substrate W on the temporary placement table 180.

The first transport robot 209 holds the substrate W placed on the temporary placement table 180, and either transports the substrate W to the substrate station in the first transport chamber 191 and then transports the substrate W to the primary cleaning module 201 or transports the substrate W directly to the primary cleaning module 201. The primary cleaning module 201 cleans the substrate W according to primary cleaning (rough cleaning). Thereafter, the first transport robot 209 receives the cleaned substrate W from the primary cleaning module 201, and then transports the substrate W to the secondary cleaning module 202.

The secondary cleaning module 202 cleans the substrate W according to secondary cleaning (finishing cleaning). Thereafter, the second transport robot 210 receives the cleaned substrate W from the secondary cleaning module 202, and then transports the substrate W to the drying module 205. The drying module 205 dries the substrate W. The transport robot 22 receives the dried substrate W from the drying module 205, and returns the substrate W to the substrate cassette placed in the front loading unit 20.

In the present embodiment, the cleaning position C is provided between the polishing position P above the polishing table 30A and the substrate transfer position T laterally of the polishing table 30A, and the auxiliary cleaning unit 100 is disposed in the position corresponding to the cleaning position C. However, another polishing table (not shown) such as a buffing table may be disposed in a position, different from the substrate transfer position T, laterally of the polishing table 30A, and a cleaning position may be defined between the polishing position P above the polishing table 30A and the polishing position above another polishing table, and then the auxiliary cleaning unit 100 may be disposed in a position corresponding to the cleaning position.

According to the polishing apparatus of the present invention, the auxiliary cleaning unit 100 ejects the cleaning liquid toward the lower surface of the rotating top ring 31A of the first polishing unit 3A that is placed in the cleaning position C between the polishing position P and the substrate transfer position T. Thus, the auxiliary cleaning unit 100 for ejecting the cleaning liquid can be disposed in a position optimum for cleaning, without being obstructed by the existence of the substrate transfer mechanism or the like. Therefore, the auxiliary cleaning unit 100 is capable of efficiently cleaning the substrate W held on the lower surface of the top ring 31A together with the lower surface of the top ring 31A. In particular, since the ejection ports 108 of the first cleaning nozzle 102 are positioned along the outer circumferential edge of the substrate W held by the top ring 31A that is placed in the cleaning position C, the auxiliary cleaning unit 100 can efficiently clean the clearance created between the outer circumferential edge of the substrate W held by the top ring 31A and the retainer ring 40 that surrounds the outer circumferential edge of the substrate W. Thus, the polishing capability of the first polishing unit 3A and the cleaning capability of the cleaning modules 201, 202 used in the cleaning section 4 are stabilized.

Although preferred embodiments of the present invention have been described in detail above, it should be understood that various changes and modifications may be made to the embodiments by those skilled in the art without departing from the scope of the appended claims.

What is claimed is:

1. A polishing apparatus for polishing a substrate, comprising:
   a polishing table configured to support a polishing surface;
   a top ring configured to hold a substrate with an outer circumferential edge of the substrate surrounded by a retainer ring and to press the substrate against said polishing surface, said top ring being movable between a polishing position above said polishing table and a substrate transfer position for transferring the substrate between a substrate transfer mechanism provided in the substrate transfer position and the top ring; and
   a cleaning unit disposed between the polishing table and the substrate transfer mechanism, and located in a cleaning position on a moving path of the top ring, the cleaning unit being configured to eject a cleaning liquid toward a lower surface of said top ring, which is rotatable, thereby cleaning the substrate when held by said top ring together with the lower surface of said top ring when said top ring is positioned at said cleaning position;

wherein said cleaning unit includes a first cleaning nozzle comprising a plurality of ejection ports directed upwardly and disposed in equally spaced intervals along a circumferential direction of said first cleaning nozzle; and wherein said plurality of ejection ports of the first cleaning nozzle being positioned directly below an inside edge of said retainer ring and a clearance created between an outer circumferential edge of the substrate when held by said top ring and said retainer ring which surrounds the outer circumferential edge of the substrate, when said top ring is positioned at said cleaning position.

2. A polishing apparatus according to claim 1, wherein said cleaning unit has a second cleaning nozzle having an ejection port, said ejection port of said second cleaning nozzle being configured to eject the cleaning liquid upwardly toward a lower surface of said top ring located at said cleaning position.

3. A polishing apparatus according to claim 2, wherein said second cleaning nozzle has a plurality of ejection ports.

4. A polishing apparatus according to claim 2, wherein said first cleaning nozzle has a semicircular shape, and said second cleaning nozzle has a straight shape.

5. A polishing apparatus according to claim 1, further comprising:

another cleaning unit provided separately from said cleaning unit and configured to clean the substrate cleaned by said cleaning unit; and a transport mechanism configured to transport the substrate from said substrate transfer position to said another cleaning unit.

6. A polishing apparatus according to claim 3, wherein said ejection ports of said first cleaning nozzle are provided at equally spaced intervals along a circular arc so that said ejection ports of said first cleaning nozzle eject the cleaning liquid toward the clearance created between the outer circumferential edge of the substrate held by said top ring and said retainer ring, and said ejection ports of said second cleaning nozzle are provided at equally spaced intervals along a diametrical direction of said top ring.

7. A polishing apparatus according to claim 1, wherein said first cleaning nozzle has an upper surface lying flush with the upper surface of said polishing table.

8. A polishing apparatus according to claim 1, wherein when said top ring is positioned at said cleaning position, said top ring and said polishing table do not vertically overlap each other.

9. A polishing apparatus according to claim 1, wherein when said top ring is positioned at said cleaning position, said top ring has a portion vertically overlapping said polishing table.

* * * * *